US010379591B2

(12) United States Patent
Engler

(10) Patent No.: US 10,379,591 B2
(45) Date of Patent: Aug. 13, 2019

(54) DUAL IN-LINE MEMORY MODULE (DIMM) FORM FACTOR BACKUP POWER SUPPLY

(71) Applicant: HEWLETT PACKARD ENTERPRISE DEVELOPMENT LP, Houston, TX (US)

(72) Inventor: David W. Engler, Cypress, TX (US)

(73) Assignee: HEWLETT PACKARD ENTERPRISE DEVELOPMENT LP, Houston, TX (US)

(*) Notice: Subject to any disclaimer, the term of this patent is extended or adjusted under 35 U.S.C. 154(b) by 147 days.

(21) Appl. No.: 15/315,976

(22) PCT Filed: Sep. 23, 2014

(86) PCT No.: PCT/US2014/056943
§ 371 (c)(1),
(2) Date: Dec. 2, 2016

(87) PCT Pub. No.: WO2016/048281
PCT Pub. Date: Mar. 31, 2016

(65) Prior Publication Data
US 2017/0123476 A1 May 4, 2017

(51) Int. Cl.
*G06F 9/00* (2006.01)
*G06F 1/3212* (2019.01)
*G11C 5/04* (2006.01)
*G11C 5/14* (2006.01)
*G06F 1/3287* (2019.01)
*G06F 13/40* (2006.01)

(52) U.S. Cl.
CPC .......... *G06F 1/3212* (2013.01); *G06F 1/3287* (2013.01); *G06F 13/4068* (2013.01); *G11C 5/04* (2013.01); *G11C 5/141* (2013.01)

(58) Field of Classification Search
CPC .. G06F 1/3212; G06F 1/3287; G06F 13/4068; G11C 5/141
USPC .............. 257/678; 365/189.09, 51; 714/6.12; 1/1; 710/305; 377/94; 327/333
See application file for complete search history.

(56) References Cited

U.S. PATENT DOCUMENTS

| 4,381,458 A * | 4/1983 | Anstey ...................... G06F 1/26 257/678 |
| 4,645,943 A | 2/1987 | Smith |
| 5,778,325 A * | 7/1998 | Lindell ................. G06F 1/1616 455/127.1 |
| 7,088,074 B2 * | 8/2006 | Clevenger ............... H01L 23/58 257/690 |
| 7,800,894 B2 | 9/2010 | Davis et al. |
| 8,607,003 B2 | 1/2013 | Bland |

(Continued)

OTHER PUBLICATIONS

Joab Jackson, "IBM X Series Servers Now Pack Flash Into Speedy DIMM Slots," Jan. 15, 2014, http://www.pcworld.com/article/2088500/ibm-x-series-servers-now-pack-flash-into-speedy-dimm-slots.html.

(Continued)

*Primary Examiner* — Aurel Prifti
(74) *Attorney, Agent, or Firm* — Hewlett Packard Enterprise Patent Department

(57) ABSTRACT

An apparatus in accordance with one example includes a battery module in a dual in-line memory module (DIMM) form factor. The battery module is insertable in a DIMM slot of a host device to provide backup power to a plurality of loads of the host device.

15 Claims, 3 Drawing Sheets

(56) References Cited

U.S. PATENT DOCUMENTS

| | | | |
|---|---|---|---|
| 8,753,138 B2 | 6/2014 | Foster | |
| 9,804,989 B2* | 10/2017 | Klein | G06F 13/4221 |
| 2003/0217210 A1* | 11/2003 | Carau, Sr. | G06F 1/26 |
| | | | 710/302 |
| 2008/0256281 A1* | 10/2008 | Fahr | G06F 13/16 |
| | | | 710/305 |
| 2009/0231798 A1* | 9/2009 | Skinner | G06F 1/185 |
| | | | 361/679.31 |
| 2010/0052625 A1 | 3/2010 | Cagno | |
| 2012/0002455 A1* | 1/2012 | Sullivan | G06F 1/10 |
| | | | 365/51 |
| 2012/0131253 A1 | 5/2012 | McKnight | |
| 2012/0154013 A1* | 6/2012 | Mera | G11C 11/4074 |
| | | | 327/333 |
| 2013/0135945 A1* | 5/2013 | Liu | G11C 5/04 |
| | | | 365/189.09 |
| 2013/0148457 A1 | 6/2013 | Sweere | |
| 2014/0153194 A1* | 6/2014 | Bahali | H01R 12/721 |
| | | | 361/728 |
| 2015/0062797 A1* | 3/2015 | Yin | G06F 1/185 |
| | | | 361/679.32 |
| 2015/0067388 A1* | 3/2015 | Xiao | G06F 11/1415 |
| | | | 714/6.12 |
| 2016/0028404 A1* | 1/2016 | Berke | G06F 21/85 |
| | | | 377/94 |

OTHER PUBLICATIONS

PCT/ISA/KR, International Search Report, dated May 19, 2015, PCT/US2014/056943, 12 pps.

\* cited by examiner

DUAL IN-LINE MEMORY MODULE (DIMM) FORM FACTOR BACKUP POWER SUPPLY

BACKGROUND

As reliance on computing systems continues to grow, so too does the demand for reliable power systems and back-up schemes for these computing systems. Servers, for example, may provide architectures for backing up data to flash or persistent memory as well as back-up power sources for powering this back-up of data after the loss of power. Backup power supplies may sometimes include energy components such as capacitors or batteries.

BRIEF DESCRIPTION OF THE DRAWINGS

Some examples of the present application are described with respect to the following figures.

DETAILED DESCRIPTION

Figure 1:
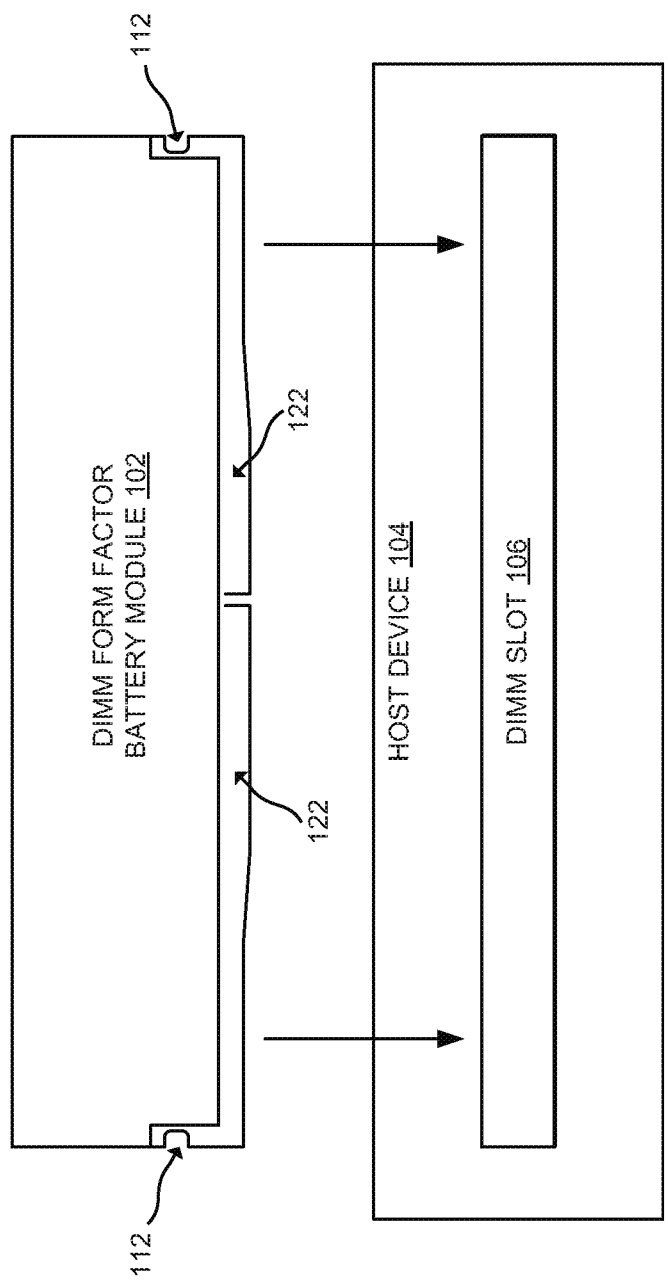
FIG. 1 is a front view of a dual in-line memory module (DIMM) form factor battery module insertable in a DIMM slot of a host device, according to one example.

A computing system can include a number of nodes that support a number of loads. The nodes can represent a number of servers, for example. A number of loads can include cache memory, dual in-line memory modules (DIMMs), array controllers, etc., associated with the servers. DIMMs include a series of dynamic random access memory (DRAM) integrated circuits that may be used in computing systems such as servers. DIMMs are mounted into multiple DIMM slots (or connectors/sockets) of the server chassis e.g., on a printed circuit board (PCB)).

Backup power supply may be required for DIMMs in the event of a loss of primary power supply. For example, there can be a need to move data from cache memory to non-volatile memory (e.g., NVDIMM) upon loss of primary power supply, to prevent damage and/or loss of data. However, moving data from cache memory to non-volatile memory can involve a power supply. A backup power supply such as a battery module can be a secondary power supply that is used to provide power for moving data from cache memory to non-volatile memory when the primary power is removed.

Conventional backup power supply modules are cabled to the loads (e.g., DIMMs) that they provide and may require additional volume and space reserved within the chassis for housing the power supply modules. This may not be easily scalable because additional cabling and real estate on the chassis may be required to provide additional backup power supply modules.

Examples disclosed herein address the above needs and challenges and needs by providing a backup power supply module/battery module that is in a DIMM form factor and retained in DIMM slots of a host device to provide backup power to a plurality of loads (e.g., DIMMs) of the host device. The DIMM form factor battery module is retained using existing DIMM mechanical and electrical interfaces. For example, mechanical capture is achieved using standard DIMM connector contacts, ears and ejection tabs, and electrical connections are achieved using standard DIMM pins (e.g., power (PWR) and communication pins). Because cables are eliminated and standard DIMM interfaces are used, energy distribution to the loads is more robust. Further energy capacity is easily scalable because additional backup power supply can be added in parallel by inserting into DIMM slots.

In one example, an apparatus includes a battery module in a dual in-line memory module (DIMM) form factor. The battery module is insertable in a DIMM slot of a host device to provide backup power to a plurality of loads of the host device.

In another example, a system includes a host device supporting at least one load. The system includes a backup power supply in a dual in-line memory module (DIMM) form factor. The system also includes a printed circuit board (PCB) that includes a DIMM connector to receive the backup power supply, where the backup power supply is to provide backup power to the at least one load.

In another example, a system includes a host device supporting at least one load. The system includes a backup power supply module in a dual memory module (DIMM) form factor. The system also includes a printed circuit board (PCB) that includes a plurality of DIMM sockets to receive the backup power supply module and a plurality of DIMMs. The backup power supply module is insertable in a DIMM socket of the plurality of DIMM sockets to provide backup power to the at least one load.

Referring now to the figures, FIG. 1 is a front view of a DIMM form factor battery module insertable in a DIMM slot of a host device, according to one example. Battery module 102 can be an energy component to convert stored energy to electrical energy to deliver power to at least one load (typically multiple loads). Examples of the battery module 102 can include, but are not limited to, a rechargeable battery, a capacitor (e.g., supercapacitor, ultracapacitor, etc.), and the like. Power, as used herein, may include current, voltage, electrical charge, watts, or other type of energy provided to the load from the battery module 102. As used herein, "battery module," "backup power supply," and "backup power supply module" may be used interchangeably and refer to the battery module 102.

Battery module 102 is in a DIMM form factor and thus retainable or insertable into a DIMM slot 106 of a host device 104. Thus, battery module 102 can be inserted in the DIMM slot 106 to provide backup power to a plurality of loads of the host device 104 when main or primary power fails. For example, battery module 102 can provide backup power to a number of storage controllers and/or a number of storage devices such as NVDIMMs of the host device 104. Host device 104 can be a device such as, but not limited to, a computing device, a server, or any other computing system that includes memory such as flash or persistent memory for backing up data of the host device 104 in the event of loss of main power (e.g., such as power failure, power dip, etc.). Thus, battery module 102 can provide back-up power to the memory (e.g., NVDIMMs, double data rate fourth generation (DDR4) DIMMs, etc.) in the event of loss of main power.

Battery module 102 includes a notch 112 (on either end of the battery module 102) and a plurality of contact pins 122 (on a bottom end of the battery module 102) to connect the battery module 102 to the DIMM slot 106, in adherence to the joint electron device engineering council (JEDEC) standard for DIMM modules and DIMM slots/connectors.

In one example, the notch 112 enable the battery module 102 to be secured to DIMM slot 106 via a latching mechanism of the DIMM slot 106 (not shown). In another example, the pins 122 provide an electrical connection between the battery module 102 and the host device 104. In certain examples, the pins 122 include at least power (PWR) pins and signal or communication pins. PWR pins are provided on the battery module 102 to charge/recharge the battery module 102 from a main power supply, and to discharge power from the battery module 102 to the load in the event of loss of main power. Signal/communication pins are provided on the battery module 102 to transmit data, commands, instructions, etc. between the battery module 102 and the host device 104, for example, via an inter-integrated circuit (I²C). As used herein, I²C is a multi-master, multi-slave, single-ended, serial computer bus used for attaching low-speed peripherals to computer motherboards and embedded systems. As noted above, the PWR pins and signal pins are JEDEC compliant.

Figure 2:
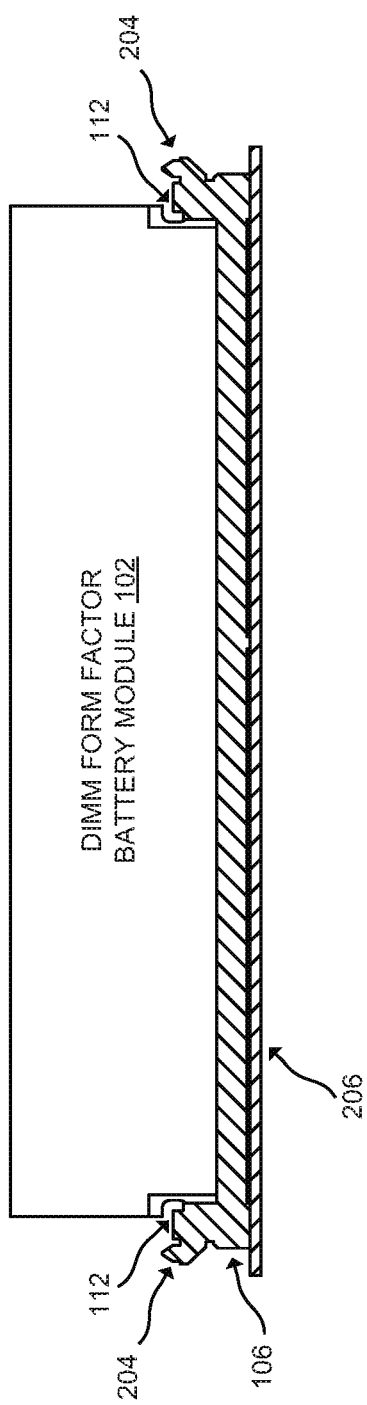
FIG. 2 is a front view of the DIMM form factor battery module inserted into the DIMM slot of a printed circuit board (PCB), according to one example.

FIG. 2 is a front view of the DIMM form factor battery module inserted into the DIMM slot of a printed circuit board (PCB), according to one example. In the example of FIG. 2, host device 104 (not shown) includes a PCB 206. For example, PCB 206 can be located in a chassis of the host device 104 (e.g., a server). PCB 206 includes the DIMM slot 106. For example, DIMM slot 106 can be fixedly coupled to the PCB 206. Battery module 106 can be connected to the PCB 206 (via DIMM slot 106) in a number of manners including, for instance surface mount or through-hold, among others.

DIMM slot 106 can include a latching mechanism 204 (such as a retention clip) on either end of the DIMM slot 106, as shown. Latching mechanism 204 can be pushed into the notch 112 of the battery module 102 to secure the battery module 102 in the DIMM slot 106. In certain examples, battery module 102 can include more than one notch 112 on either side. For example, the battery module 102 can include two notches (e.g., an upper notch and a lower notch). In such an example, the DIMM slot 106 can secure the battery module 102 on the lower notch such that the overall height of the battery module 102 when inserted into the DIMM slot 106 is not increased, as compared to securing the battery module 102 via the upper notch. Further, in certain examples, the upper notch can be used to attach additional components to the battery module 102 such as heat management components (e.g., heat spreader) that removes heat from the battery module 102.

Once connected and secured to the DIMM slot 106, electrical pins of the battery module can make contact with corresponding pins on the PCB 206. The electrical pins can include, for example, a pair PWR pins and a pair of communication pins in accordance with the JEDEC standard for DIMM modules. PWR pins can be for providing 12V power to the battery module 102 (e.g., during charging) from the main power of the host device 104, and for discharging 12V power from the battery module 102 to a plurality of DIMM devices (e.g., DDR4 DIMM, NVDIMM, DDR3 DIMM), when the main power is removed.

Figure 3:
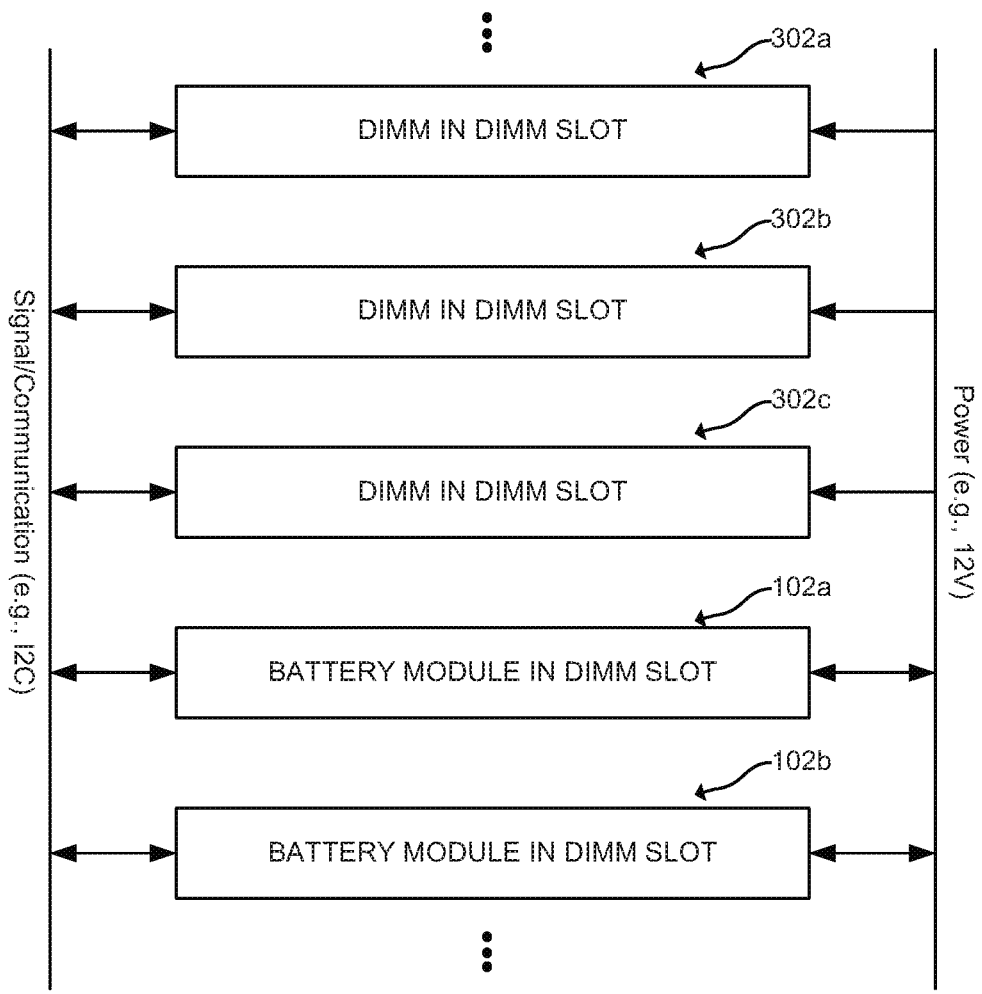
FIG. 3 illustrates multiple DIMMs and multiple DIMM form factor battery modules inserted, in parallel, into DIMM slots, according to one example.

FIG. 3 illustrates multiple DIMMs and multiple DIMM form factor battery modules inserted, in parallel, into DIMM slots, according to one example. In the example of FIG. 3, a plurality of DIMMs 302a-302c are inserted into DIMM slots and a plurality of battery modules 102a-102b are inserted into DIMM slots. As shown, the DIMMs 302a-302c and DIMM form factor battery modules 102a-102b are arranged in parallel. Battery modules 102a-102b can be retained in any of the plurality of DIMM slots available on the PCB of the host device, to provide backup power to the DIMM devices (e.g., DDR4 DIMMs). Accordingly, backup power can be increased or expanded by inserting additional battery modules 102, in parallel, into the DIMM slots.

Each device 302a-302c, 102a-102c includes at least PWR pins and signal/communication pins for interfacing with the PCB of the host device. The PWR and signal pins comply with JEDEC standards. PWR pins in the battery modules 102a-102b enable power to be provided to the battery modules 102a-102h from a main power supply, for example during charging, and enable the battery modules to provide backup power to the DIMM devices 302a-302c when the main power fails, as shown by the double arrows of the battery modules 102a-102b. Signal pins in the battery modules 102a-102b enable signals (e.g., control signal) to be communicated between the battery modules 102a-102b and the PCB, for example using I²C standards. For example, through the signal pins, battery modules 102a-102b can be identified and located on the PCB. As another example, through the signal pins, a backup power control module on the PCB (not shown) can control power charging and discharging of the battery modules 102a-102b, for example, based on the power capacity of the battery modules 102a-102h and the backup power demands of the host device 104 (i.e., the DIMM devices 302a-302c).

In the foregoing description, numerous details are set forth to provide an understanding of the present disclosure. However, it will be understood by those skilled in the art that the present disclosure may be practiced without these details. While the present disclosure has been disclosed with respect to a limited number of examples, those skilled in the art will appreciate numerous modifications and variations therefrom. It is intended that the appended claims cover such modifications and variations as fall within the true spirit and scope of the present disclosure.

What is claimed is:

1. An apparatus, comprising:
   a battery module in a dual in-line memory module (DIMM) form that adheres to a standard for a DIMM and having a structure that is receivable by a DIMM slot, wherein the battery module is insertable in a DIMM slot of a host device to provide backup power to a plurality of loads of the host device.

2. The apparatus of claim 1, wherein the battery module includes a notch and a plurality of contact pins to connect the battery module to the DIMM slot.

3. The apparatus of claim 2, wherein the plurality of contact pins includes a plurality of power (PWR) pins and a plurality of signal pins.

4. The apparatus of claim 1, wherein the DIMM slot is fixedly coupled to a printed circuit board (PCB) of the host device and wherein the battery module is connected to the PCB via the DIMM slot.

5. The apparatus of claim 4, wherein the battery module is attached to the PCB via at least one of a surface mount connection and a through-hole connection.

6. A system comprising:
   a host device supporting at least one load;
   a backup power supply in a dual in-line memory module (DIMM) form that adheres to a standard for a DIMM and having a structure that is receivable by a DIMM connector;
   a printed circuit board (PCB) including the DIMM connector to receive the backup power supply, wherein the backup power supply is to provide backup power to the at least one load.

7. The system of claim 6, wherein the backup power supply includes at least one notch and a plurality of electrical pins to connect the backup power supply to the PCB via the DIMM connector.

8. The system of claim 7, wherein the DIMM connector includes a latching mechanism to secure the backup power supply via the at least one notch.

9. The system of claim 7, wherein the plurality of electrical pins includes at least a pair of power (PWR) pins and a pair of communication pins.

10. A system comprising:
- a host device supporting at least one load;
- a backup power supply module in a dual in-line memory module (DIMM) form that adheres to a standard for a DIMM and having a structure that is receivable by a DIMM socket; and
- a printed circuit board (PCB) including a plurality of DIMM sockets to receive the backup power supply module and a plurality of DIMMs, the backup power supply module and a plurality of DIMMs, wherein the backup power supply module is insertable in a DIMM socket of the plurality of DIMM sockets to provide backup power to the at least one load.

11. The system of claim 10, wherein the at least one load includes the plurality of DIMMs.

12. The system of claim 10, wherein the backup power supply module includes at least one notch and a plurality of contact pins to connect to a DIMM socket of the plurality of DIMM sockets.

13. The system of claim 12, wherein the plurality of contact pins includes at least a pair of power (PWR) pins and a pair of communication pins.

14. The system of claim 10, comprising a second backup power supply module in the DIMM form factor insertable in a second DIMM socket of the plurality of DIMM sockets, wherein the backup power supply module and the second backup power supply module are insertable in parallel in the DIMM socket and the second DIMM socket to provide backup power to the at least one load.

15. The system of claim 10, comprising a backup power control module to determine, based on monitored power, a backup power demand of the at least one load and to provide backup power from the backup power supply module to the at least one load.

* * * * *